(12) United States Patent  (10) Patent No.: US 6,510,059 B2
Mitani et al.  (45) Date of Patent: Jan. 21, 2003

(54) CONDUCTIVE RESIN, ELECTRONIC MODULE USING CONDUCTIVE RESIN, AND METHOD OF MANUFACTURING ELECTRONIC MODULE

(75) Inventors: Tsutomu Mitani, Hyogo (JP); Yukihiro Ishimaru, Osaka (JP); Takashi Kitae, Osaka (JP); Hiroaki Takezawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 2 days.

(21) Appl. No.: 09/889,523

(22) PCT Filed: Dec. 13, 2000

(86) PCT No.: PCT/JP00/08833
§ 371 (c)(1),
(2), (4) Date: Jul. 18, 2001

(87) PCT Pub. No.: WO01/44373
PCT Pub. Date: Jun. 21, 2001

(65) Prior Publication Data
US 2002/0185306 A1 Dec. 12, 2002

(30) Foreign Application Priority Data
Dec. 17, 1999 (JP) ............................................ 11-359723

(51) Int. Cl.[7] ................................................. H05K 1/18
(52) U.S. Cl. ........................ 361/762; 252/511; 205/925
(58) Field of Search .......................... 252/511; 205/925, 205/165, 167; 361/712, 736, 739, 743, 751, 760, 762

(56) References Cited

U.S. PATENT DOCUMENTS 5,399,416 A * 3/1995 Bujard ........................ 361/712

FOREIGN PATENT DOCUMENTS

| EP | 0 530 840 A1 | 3/1993 |
| EP | 0 892 027 | 1/1999 |
| JP | 55-52291 A | 4/1980 |
| JP | 63-273393 A | 11/1988 |
| JP | 5-67869 A | 3/1993 |
| JP | 11-5961 A | 1/1999 |
| JP | 11-289153 | 10/1999 |
| JP | 2000-49450 A | 2/2000 |
| JP | 2000-239636 A | 9/2000 |

* cited by examiner

Primary Examiner—Shawn Riley
(74) Attorney, Agent, or Firm—Merchant & Gould P.C.

(57) ABSTRACT

In mounting an electronic component using a conductive resin, a conductive resin containing a specific diluent component is used as the conductive resin, or a specific diluent component is applied to the conductive resin before being cured. This allows connection in a portion where an electrode (5) of an electronic component (4) and an electrode (2) of a circuit substrate (1) are opposed to each other to be provided via a resin (3a) containing a conductive filler as a main component, and allows connection at a lower surface of the electronic component (4) and connection in vicinities of the electrode (5) to be provided via a resin (3b, 3c) containing a binder resin as a main component that has oozed out of the conductive resin. The resin (3b, 3c) containing the binder resin as the main component increases junction strength.

23 Claims, 6 Drawing Sheets

CONDUCTIVE RESIN, ELECTRONIC MODULE USING CONDUCTIVE RESIN, AND METHOD OF MANUFACTURING ELECTRONIC MODULE

TECHNICAL FIELD

The present invention relates to a conductive resin that functions as an adhesive that is used for electric connections in an electronic component or as a heat transfer medium in an electronic component, an electronic-component-mounted body in which the conductive resin is used, and a method of manufacturing an electronic-component-mounted body.

BACKGROUND ART

Due to recent increased ecological awareness, in the field of the electronic component mounting techniques, limitations are about to be imposed on lead contained in a solder. Hence, it is an urgent task to establish a junction technique that does not utilize lead in the mounting of electronic components. Examples of the lead-free mounting technique include a technique in which a lead-free solder is used and a technique in which a conductive resin is used. In particular, increased attention is directed to the conductive resin, which is expected to achieve such advantages as: providing increased flexibility of a junction portion; and allowing the mounting process to be conducted at a lower temperature, to be organic-solvent-free, and not to require washing.

A conventional conductive resin typically is a resin obtained by dispersing a conductive filler such as a metallic powder in an epoxy resin-based binder resin component. For instance, in the case where a component electrode of an electronic component is connected with a substrate electrode of a circuit substrate using a conductive resin, contact can be obtained by means of the binder resin between respective particles of the conductive filler, between the conductive filler and the component electrode, and between the conductive filler and the substrate electrode, hence electric connection is provided therebetween, respectively. At the same time, the electronic component and the substrate electrode are bonded with each other with the conductive resin, thereby being mechanically connected with each other.

In the case of a mounting technique utilizing a conductive resin, the connection at a junction portion between the electronic component and the circuit substrate is provided via the resin component, which is flexibly deformed in response to heat or external force. Thus, the resin has an advantage in that cracks hardly occur as compared with a solder that provides a junction portion made of an alloy. Therefore, great expectations are placed on the resin as a substitute for the solder.

However, in an attempt to use a conventional conductive resin as a substitute for the solder, it has been difficult to achieve connection strength substantially equal to that of the solder.

A property of the conductive resin for bonding the component electrode with the substrate electrode is exhibited, as described above, when, for instance, an epoxy resin-based binder resin adheres to the component electrode and to the substrate electrode. The epoxy resin-based binder resin is one of the resin materials having the greatest bond strength with metals, and is considerably superior to the other resin materials in mechanical strength of the resin per se after being cured. Therefore, it is used in various adhesive structural members. It, however, does not provide an alloy bonding like at a solder junction portion, and hence, it is difficult to achieve a junction strength substantially equal to that achieved by the solder against an external force applied to a junction portion, such as shearing, pulling, bending, and twisting.

Principal causes of this problem are described below, with reference to FIG. 6.

FIG. 6 is a schematic cross-sectional view of an electronic-component-mounted body (hereinafter sometimes referred to as mounted body) in which an electrode 45 of an electronic component 44 is connected with a substrate electrode 42 of a circuit substrate 41 using a conventional conductive resin 43. The conductive resin 43 is disposed at a predetermined position on the substrate electrode 42, for instance, by printing or by means of a dispenser. Thereafter, the electronic component 44 is mounted thereon and the resin is cured with heat, so that electric connection and mechanical connection are provided. Here, a junction portion obtained maintains a size upon the aforementioned printing. Besides, throughout a junction interface between the electrode 45 and the conductive resin 43 and a junction interface between the substrate electrode 42 and the conductive resin 43, a conductive filler and a binder resin are dispersed and mixed with each other substantially homogeneously.

Generally the content of the conductive filler in the conventional conductive resin is approximately 80 percent by weight. The conductive filler, made of silver for instance, has a specific gravity of approximately 10, and the binder resin has a specific gravity of approximately 1.1. Therefore, an actual contact area of the binder resin with the component electrode and the substrate electrode, which actually provides the mechanical connection at the foregoing junction portion, that is, the junction strength, is approximately ½ of an apparent junction area. Therefore, the junction strength lowers as compared with the case of the binder resin solely.

In other words, in spite of the advantages of flexibility and rare occurrence of cracks in comparison with those of the solder, the conventional conductive resin has a disadvantage of insufficient absolute junction strength as compared with that of the solder. Consequently, the conductive resin has not yet been widely used as an alternative junction material for the solder.

DISCLOSURE OF THE INVENTION

An object of the present invention is to provide a new conductive resin that maintains the advantage of hardly cracking and that provides an increased junction strength relative to a conventional conductive resin, an electronic-component-mounted body having an increased junction strength, and a manufacturing method of the same.

To achieve the foregoing object, the present invention provides a conductive resin that is used to bond an electronic component and a substrate electrode, and upon being heated, comes to have a portion containing a conductive filler as a main component and a portion containing a binder resin as a main component. Further, the present invention provides an electronic-component-mounted body in which a portion containing a conductive filler as a main component and a portion containing a binder resin as a main component are formed, in a conductive resin. Further, the present invention provides a method for manufacturing an electronic-component-mounted body in which a portion containing a conductive filler as a main component and a portion containing a binder resin as a main component are substantially separately formed, in a conductive resin.

More specifically, a conductive resin of the present invention includes a conductive filler and a binder resin, the conductive filler and the binder resin constituting a main component of the conductive resin, in which the conductive filler is dispersed substantially homogeneously in the binder resin. The conductive resin is characterized in that the conductive resin before being cured is used to bond a plurality of adhesion targets, and when the conductive resin is heated, the conductive filler and the binder resin are substantially separated from each other, so that the conductive resin after being cured has a portion containing the conductive filler as a main component and a portion containing the binder resin as a main component. This configuration thus allows a portion having the binder resin as the main component to be formed in the cured conductive resin, and hence, makes it possible to increase the junction strength between the adhesion targets by means of this portion.

Furthermore, an electronic-component-mounted body of the present invention includes an electronic component having an electrode and a circuit substrate having an electrode, in which the electrode of the electronic component and the electrode of the circuit substrate are connected with each other via a conductive resin containing a conductive filler and a binder resin. The electronic-component-mounted body is characterized in that, in a region where the electrodes are opposed to each other, the conductive resin has the conductive filler as a main component, and that, in a region except for the region where the electrodes are opposed to each other, at least a part of the conductive resin has the binder resin as a main component. In this configuration, the portion of the conductive resin having the conductive filler as the main component provides electric connection and mechanical connection, while the portion thereof having the binder resin as the main component provides electric insulation and mechanical connection. The presence of the portion having the binder resin as the main component particularly allows the junction strength of the electronic component to increase.

Furthermore, a first electronic-component-mounted body manufacturing method of the present invention is characterized by including the steps of applying the foregoing conductive resin of the present invention at a predetermined position on a circuit substrate; placing an electronic component at the predetermined position where the conductive resin is applied; and curing the conductive resin. These steps are conducted in the stated order.

Furthermore, a second electronic-component-mounted body manufacturing method of the present invention is characterized by including the steps of: applying to at least either one of a circuit substrate and an electronic component a material effective in improving the wettability of a binder resin of a conductive resin with respect to the circuit substrate or a component member of the electronic component; applying the conductive resin at a predetermined position on the circuit substrate; placing the electronic component at the predetermined position where the conductive resin is applied; and curing the conductive resin. These steps are conducted in the stated order.

Furthermore, a third electronic-component-mounted body manufacturing method of the present invention is characterized by comprising the steps of: applying a conductive resin at a predetermined position on a circuit substrate; applying to at least one of the circuit substrate, the conductive resin, and an electronic component a material effective in improving wettability of a binder resin of the conductive resin with respect to the circuit substrate or a component member of the electronic component; placing the electronic component at the predetermined position where the conductive resin is applied; and curing the conductive resin. These steps are conducted in the stated order.

Furthermore, a fourth electronic-component-mounted body manufacturing method is characterized by including the steps of: applying a conductive resin at a predetermined position on a circuit substrate; placing an electronic component at the predetermined position where the conductive resin is applied; applying to at least a portion where an electronic component is placed a material effective in improving wettability of a binder resin of the conductive resin with respect to the circuit substrate or a component member of the electronic component; and curing the conductive resin. These steps are conducted in the stated order.

According to the first electronic-component-mounted body manufacturing method, the conductive resin of the present invention is used. Therefore, the conductive filler and the binder resin in the conductive resin substantially are separated when being heated, and hence, a portion having the conductive filler as the main component and a portion having the binder resin as the main component are formed in the cured conductive resin.

Furthermore, according to the second to fourth electronic-component-mounted body manufacturing method, the material effective in improving the wettability of the binder resin of the conductive resin with respect to the circuit substrate or the electronic component is applied. Therefore, the conductive filler and the binder resin substantially are separated in a subsequent heating step, and a portion having the conductive filler as the main component and a portion having the binder resin as the main component are formed in the cured conductive resin.

Consequently, any one of the first through fourth mounted body manufacturing methods makes it possible to increase the junction strength of the electronic component by means of the portion having the binder resin as the main component.

BRIEF DESCRIPTION OF DRAWINGS

FIGS. 1A to 1C illustrate steps that are conducted in this order in the method, respectively.

FIGS. 2A to 2D illustrate steps that are conducted in this order in the method, respectively.

FIGS. 3A to 3D illustrate steps that are conducted in this order in the method, respectively.

FIGS. 4A to 4D illustrate steps that are conducted in this order in the method, respectively.

BEST MODE FOR CARRYING OUT THE INVENTION

Figure 1A:
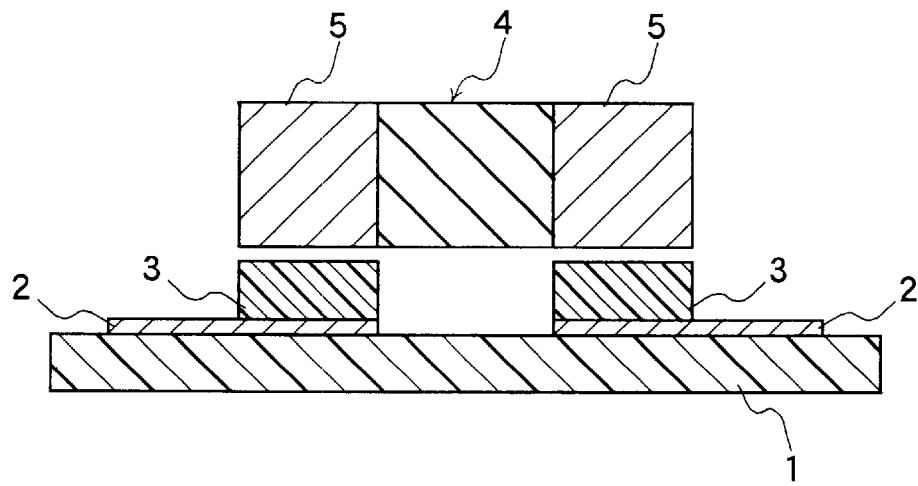
FIGS. 1A to 1C are schematic cross-sectional views illustrating a method of manufacturing an electronic-component-mounted body according to a first embodiment of the present invention.

As described above, a conductive resin of the present invention contains a conductive filler and a binder resin, and the conductive filler and the binder resin constitute a main component of the conductive resin. The conductive filler is dispersed substantially homogeneously in the binder resin. A plurality of adhesion targets are bonded using the conductive resin before being cured, and then, heating of the conductive resin causes the viscosity of the binder resin to decrease, thereby allowing the binder resin to flow easily. Accordingly, the binder resin spreads over surfaces of the adhesion targets because of the capillary phenomenon occurring between the adhesion targets and the binder resin, and this allows the conductive filler and the binder resin to substantially separate from each other. As a result, the conductive resin after being cured has a portion containing the conductive filler as the main component and a portion containing the binder resin as the main component. The portion containing the conductive filler as the main component exhibits a relatively high conductivity and a relatively low mechanical strength, and the portion containing the binder resin as the main component exhibits a relatively low conductivity and a relatively high mechanical strength.

In the foregoing configuration, to cause the binder resin component to ooze out easily upon application of heat to the conductive resin, a diluent component contained in the conductive resin preferably is in a range of 1 percent by weight (wt %) to 50 wt %, both inclusive, with respect to a total amount of organic components of the conductive resin, and more preferably in a range of 5 wt % to 20 wt %. Examples used as such a diluent component include solvents that are volatile at relatively low temperatures, reactive diluents, and mixtures of any of the same. More specifically, such solvents include alcohol-type solvents such as ethylene glycol, diethylene glycol, and triethylene glycol. As the reactive diluent, an epoxy-type reactive diluent can be used, for instance, ADEKA GLYCIROL (produced by ASAHI DENKA KOGYO K.K.).

Furthermore, the content of the conductive filler in the conductive resin (including a diluent component as described above if it is contained therein) preferably is not less than 20 wt %, and more preferably not less than 30 wt % as to its lower limit, and it preferably is less than 70 wt %, and more preferably less than 50 wt % as to its upper limit. In the case where the content of the conductive filler is less than the foregoing lower limit, an electric resistance at the junction portion increases. On the other hand, in the case where the content of the same is more than the foregoing upper limit, a mechanical strength at the junction portion decreases. A content of a conductive filler in a conventional typical conductive resin normally is approximately 75 wt % to 90 wt %. In the conductive resin of the present invention the binder resin oozes out upon being heated and is cured, thereby causing a portion containing the binder resin as the main component to be formed. Therefore, a sufficient conductivity and a sufficient mechanical strength can be obtained with a smaller content of the conductive filler than conventionally.

Furthermore, the conductive filler in the conductive resin preferably has a property of catching on one another. A conductive filler with such a property does not flow away along with the binder resin when the binder resin flows out upon the heating of the conductive resin. Accordingly, the conductive filler and the binder resin are substantially separated easily. In order to cause the conductive filler to possess a property of catching on one another, the conductive filler may be prepared by mixing conductive fillers in different shapes (for instance, a scale-shape type and a crenated-shape type), by mixing conductive fillers in various sizes, by using a conductive filler whose pieces are each in a shape such that they easily catch on one another, etc. Examples of the conductive filler in the shape of easily catching on each other include a conductive filler of a tetrapod-shape type (for instance, "Pana-Tetra" (tetrapod-shape zinc oxide whisker produced by Matsushita AMTEC Co., Ltd.) whose surfaces are plated with gold and nickel), and a conductive filler of a dendritic-crystalline-shape type (so-called dendrite).

Furthermore, the conductive resin preferably has a volume resistivity value of not more than $1 \times 10^{-1}$ $\Omega \cdot cm$ more preferably not more than $5 \times 10^{-3}$ $\Omega \cdot cm$, and most preferably not more than $1 \times 10^{-3}$ $\Omega \cdot cm$ in the portion in which the conductive filler is the main component. Besides, the conductive resin preferably has a volume resistivity value of notless than $1 \times 10^{+3}$ $\Omega \cdot cm$, more preferably notless than $1 \times 10^{+6}$ $\Omega \cdot cm$, and most preferably notless than $1 \times 10^{+8}$ $\Omega \cdot cm$ in the portion in which the binder resin is the main component. In the case where the portion in which the conductive filler is the main component has a volume resistivity value excessive of the foregoing range, excellent electric connection cannot be obtained, thereby making it difficult to secure conductivity. Besides, in the case where the portion in which the binder resin is the main component has a volume resistivity value less than the foregoing range, excellent electric insulation is not obtained, and also the mechanical strength decreases. Incidentally, in the present invention, "the conductive filler (or the binder resin) is the main component" means that the contained conductive filler (or binder resin) is not less than 50 wt %, preferably not less than 60 wt %, and more preferably not less than 70 wt % with respect to the entirety.

An electronic-component-mounted body of the present invention is configured so that an electrode of an electronic component and an electrode on a circuit substrate are connected via a conductive resin containing a conductive filler and a binder resin. The conductive resin in a region where these electrodes are opposed to each other has the conductive filler as the main component, thereby providing electric connection and mechanical connection therebetween. On the other hand, at least a part of the conductive resin in a region except for the region where the electrodes are opposed to each other has the binder resin as the main component, thereby providing electric insulation and mechanical connection. Here, "a region except for the region where the electrodes are opposed to each other" includes, for instance, a region where the electronic component except for the electrode is opposed to the circuit substrate, and a region where the electronic component and the circuit substrate are not opposed directly (for instance, a region between a surface of the circuit substrate and a surface of an electronic component perpendicular to the surface of the circuit substrate). Such a mounted body easily can be formed using the conductive resin of the present invention, or by any one of the first through fourth mounted body manufacturing methods.

In the foregoing mounted body, the volume resistivity value in the portion having the conductive filler as the main component and the volume resistivity value in the portion having the binder resin as the main component preferably are in the aforementioned ranges, respectively.

Furthermore, in the foregoing mounted body, in the region where the electronic component except for the electrode is opposed to the circuit substrate, connection entirely is made via the resin having the binder resin as the main component. This allows the junction strength between the electronic component and the circuit substrate to be increased most while allowing the necessary electronic insulation to be secured.

A first electronic-component-mounted body manufacturing method of he present invention includes the steps of: applying the conductive resin of he present invention at a predetermined position on a circuit substrate; placing an electronic component at the predetermined position where the conductive resin is applied; and curing the conductive resin, these steps being conducted in the stated order. This allows the mounted body of the present invention to be obtained easily.

A second electronic-component-mounted body manufacturing method of the present invention includes the steps of applying to at least either one of a circuit substrate and an electronic component a material effective in improving wettability of a binder resin of a conductive resin with respect to the circuit substrate or a component member of the electronic component; applying the conductive resin at a predetermined position on the circuit substrate; placing the electronic component at the predetermined position where the conductive resin is applied; and curing the conductive resin, these steps being conducted in the stated order.

In the case where a conventional conductive resin is used, it is difficult to obtain the foregoing electronic-component-mounted body of the present invention by an electronic-component-mounted body manufacturing method identical to that of the prior art. According to the foregoing second mounted body manufacturing method of the present invention, however, a material effective in improving the wettability of the binder resin of the conductive resin with respect to the circuit substrate or a component member of the electronic component is applied beforehand to at least one of the circuit substrate and the electronic component. This provides improvement of the wettability of the binder resin component of the conductive resin with respect to the circuit substrate or the electronic component in the subsequent heat application to the conductive resin. This consequently makes it easier to form the foregoing mounted body of the present invention even in the case where a conventional conductive resin is used.

It should be acknowledged that it is possible to use the conductive resin of the present invention as the foregoing conductive resin in the second mounted body manufacturing method, whereby an identical mounted body can be formed. In other words, the conductive resin is not specifically limited in the second electronic-component-mounted body manufacturing method of the present invention.

A third electronic-component-mounted body manufacturing method of the present invention includes the steps of: applying a conductive resin at a predetermined position on a circuit substrate; applying to at least one of the circuit substrate, the conductive resin, and an electronic component a material effective in improving wettability of a binder resin of the conductive resin with respect to the circuit substrate or a component member of the electronic component; placing the electronic component at the predetermined position where the conductive resin is applied; and curing the conductive resin, these steps being conducted in the stated order.

In the case where a conventional conductive resin is used, it is difficult to obtain the foregoing electronic-component-mounted body of the present invention by an electronic-component-mounted body manufacturing method identical to that of the prior art. According to the foregoing third mounted body manufacturing method of the present invention, however, a material effective in improving the wettability of the binder resin of the conductive resin with respect to the circuit substrate or a component member of the electronic component is applied beforehand to at least one of the circuit substrate, the conductive resin, and the electronic component. This provides improvement of the wettability of the binder resin component of the conductive resin with respect to the circuit substrate or the electronic component in the subsequent heat application to the conductive resin. This consequently makes it easier to form the foregoing mounted body of the present invention even in the case where a conventional conductive resin is used.

It should be acknowledged that it is possible to use the conductive resin of the present invention as the foregoing conductive resin in the third mounted body manufacturing method, whereby an identical mounted body can be formed. In other words, the conductive resin is not specifically limited in the third electronic-component-mounted body manufacturing method of the present invention.

A fourth electronic-component-mounted body manufacturing method of the present invention includes the steps of applying a conductive resin at a predetermined position on a circuit substrate; placing an electronic component at the predetermined position where the conductive resin is applied; applying to at least a portion where an electronic component is placed a material effective in improving wettability of a binder resin of the conductive resin with respect to the circuit substrate or a component member of the electronic component; and curing the conductive resin, these steps being conducted in the stated order.

In the case where a conventional conductive resin is used, it is difficult to obtain the foregoing electronic-component-mounted body of the present invention by an electronic-component-mounted body manufacturing method identical to that of the prior art. According to the foregoing fourth mounted body manufacturing method of the present invention, however, a material effective in improving the wettability of the binder resin of the conductive resin with respect to the circuit substrate or a component member of the electronic component is applied beforehand to at least the electronic component-mounted portion. This provides improvement of the wettability of the binder resin component of the conductive resin with respect to the circuit substrate or the electronic component in the subsequent heat application to the conductive resin. This consequently makes it easier to form the foregoing mounted body of the present invention even in the case where a conventional conductive resin is used.

It should be acknowledged that it is possible to use the conductive resin of the present invention as the foregoing conductive resin in the fourth mounted body manufacturing method, whereby an identical mounted body can be formed. In other words, the conductive resin is not specifically limited in the fourth electronic-component-mounted body manufacturing method of the present invention.

Examples of the material effective in improving wettability that is used in the foregoing second through fourth mounted body manufacturing methods include alcohol-type solvents, reactive diluents, and mixtures of any of the same. Applicable as the alcohol-type solvent is ethylene glycol, diethylene glycol, triethylene glycol, or the like. Applicable as the reactive diluent is an epoxy-type reactive diluent, for instance, "ADEKA GLYCIROL (produced by ASAHI DENKA KOGYO K.K.).

In the conductive resin curing step in the foregoing first through fourth mounted body manufacturing methods, the viscosity lowering sub-step for causing the binder resin component having been substantially separated from the conductive resin to ooze out, and the binder resin component curing sub-step, preferably are conducted in this order. More specifically, in the heat treatment of the conductive resin, a first temperature at which the binder resin component of the conductive resin has a low viscosity is kept for a predetermined period. Subsequently the conductive resin is heated to a second temperature at which the binder resin component is cured, and the second temperature is kept for a predetermined period. Since the conductive filler and the binder resin in the conductive resin are surely separated from each other through the viscosity lowering sub-step (at the first temperature), a portion having the conductive filler as the main component and a portion having the binder resin as the main component easily can be formed in the conductive resin through the subsequent curing sub-step (at the second temperature).

In the foregoing first through fourth mounted body manufacturing methods, in the step of curing the conductive resin, it is preferable that the binder resin substantially separated from the conductive resin oozes out, thereby causing at least a part of a region except for the region where the electrode of the electronic component and the electrode of the circuit substrate are opposed to each other to be connected via a resin containing as the main component the binder resin that has oozed out. This allows the content of the conductive filler to increase in the region where the foregoing electrodes are opposed to each other, providing excellent electric connection. On the other hand, this allows a resin portion in which a content of the conductive filler is small and the binder resin is the main component to be formed in the region except for the region where the electrodes are opposed to each other, thereby contributing to increased junction strength of the electronic component.

EMBODIMENTS

First Embodiment

Figure 1B:
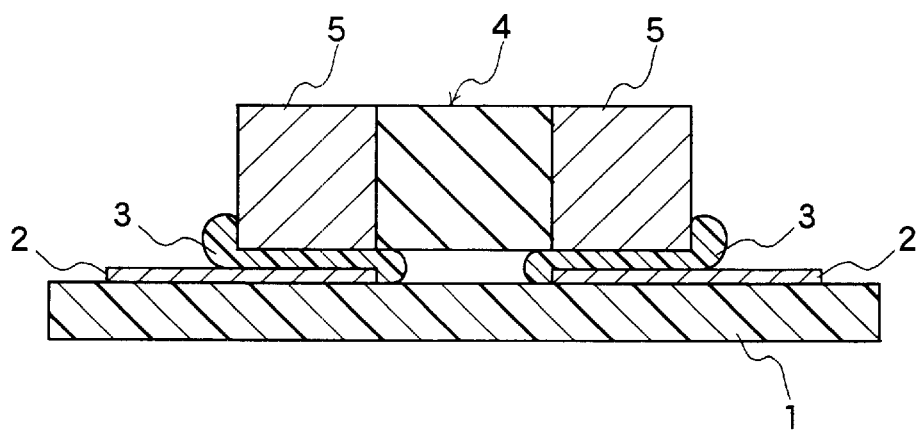
Figure 1C:
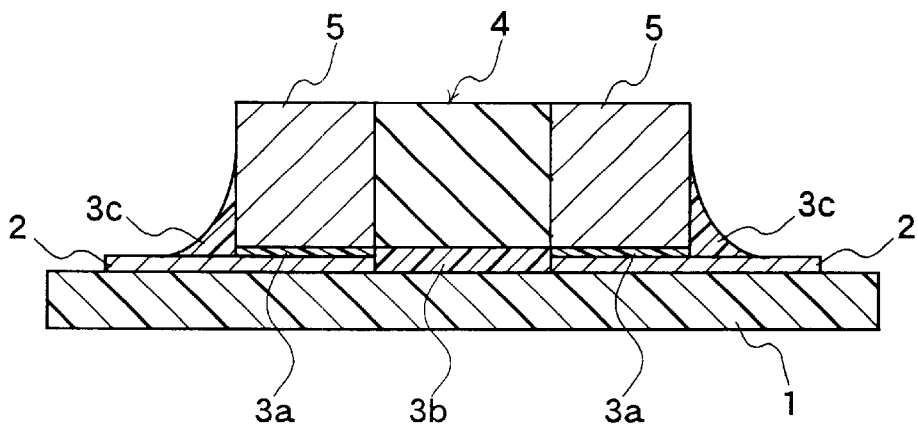

The following description will depict an embodiment of an electronic-component-mounted body that is formed using the conductive resin of the present invention, while referring to FIGS. 1A through 1C.

FIGS. 1A to 1C are schematic cross-sectional views illustrating steps of the method of manufacturing an electronic-component-mounted body, in an order in which the steps are conducted.

First of all, as shown in FIG. 1A, a conductive resin 3 is disposed by printing at predetermined positions on substrate electrodes 2 of a circuit substrate 1, and an electronic component 4 having electrodes 5 is aligned and placed on the conductive resin 3 that is not yet cured, as shown in FIG. 1B. Subsequently, the conductive resin 3 is heated to a curing temperature of the conductive resin 3 so as to be cured. FIG. 1C illustrates a finished state of the electronic-component-mounted body of the present invention in which the conductive resin 3 is already cured.

To form the conductive resin 3 in the present embodiment, an epoxy resin, an amine-type hardener, and diethylene glycol were used as the binder, the hardener, and the alcohol-type solvent, respectively.

An amount of added diethylene glycol in the present embodiment was varied in a range of 0 wt % to 70 wt % with respect to a total amount of organic components in the conductive resin. After the epoxy resin and the amine-type hardener were kneaded, the diethylene glycol was added thereto at room temperature.

The conductive filler used was a mixture of approximately 60 wt % of a scale-shape type and approximately 40 wt % of an approximately-spherical-shape type. The conductive filler was dispersed substantially homogeneously in the conductive resin in a non-cured state.

As the electronic component 4, a chip resistor was used.

Table 1 shows shear bond strengths that were exhibited by electronic-component-mounted bodies formed with various addition percentages by weight of diethylene glycol (DEG), and states of junction portions between the electronic component 4 and the circuit substrate 1. In Table 1, the sample having 0 wt % of diethylene glycol is equivalent to a conventional conductive resin, and is shown as a control.

In the shear bond strength measurement, samples were used, each of which was formed by providing a 3216-size chip resistor as an electronic component on a FR-4 substrate having copper electrodes so that the chip resistor was connected with the electrodes via a conductive resin. A shear bond strength was defined as follows: the sample was set in a shear strength tester so that a lengthwise-direction side face of the foregoing chip resistor was in contact with a shear tester indenter, and the indenter was pressed against the chip resistor at a shear speed of 10 mm/min until the chip resistor dropped off from the circuit substrate; the load when the chip resistor dropped was defined as the shear bond strength.

The junction portion state was, as illustrated in FIG. 1C, examined as to presence/absence of a resin-bond portion 3b in a region where the electronic component 4 except for the electrodes 5 was opposed to the circuit substrate 1 (i.e., an under-electronic-component region) (in the case of presence, a state of the same); and presence/absence of a fillet-like reinforcing portion 3c on side walls of the electrodes 5 of the electronic component 4, which was identical to that formed in the case of solder connection (in the case of presence, a height of the same).

TABLE 1

| SAMPLE NO. | DEG CONTENT (wt %) | SHEAR BOND STRENGTH (N) | PRESENCE/ABSENCE OF RESIN BONDING UNDER ELECTRONIC COMPONENT | PRESENCE/ABSENCE OF FILLET |
|---|---|---|---|---|
| 1 | 0 | 29.4 | ABSENT | ABSENT |
| 2 | 3 | 39.2 | SLIGHTLY | SLIGHTLY PRESENT |
| 3 | 5 | 49.0 | THOROUGHLY | ABOUT ½ OF COMPONENT HEIGHT |
| 4 | 10 | 51.4 | THOROUGHLY | ABOUT ½ OF COMPONENT HEIGHT |

TABLE 1-continued

| SAMPLE NO. | DEG CONTENT (wt %) | SHEAR BOND STRENGTH (N) | PRESENCE/ABSENCE OF RESIN BONDING UNDER ELECTRONIC COMPONENT | PRESENCE/ABSENCE OF FILLET |
|---|---|---|---|---|
| 5 | 20 | 52.0 | THOROUGHLY | ABOUT ½ OF COMPONENT HEIGHT |
| 6 | 30 | 35.5 | THOROUGHLY | SLIGHTLY PRESENT |
| 7 | 40 | 31.1 | THOROUGHLY | SLIGHTLY PRESENT |
| 8 | 50 | 27.3 | WITH MANY PORES | SLIGHTLY PRESENT |
| 9 | 60 | 22.8 | ABSENT | ABSENT |
| 10 | 70 | 15.9 | ABSENT | ABSENT |

As shown in Table 1, when the content of diethylene glycol added thereto is not less than 1 wt % and not more than 50 wt %, and more particularly not less than 5 wt % and not more than 20 wt %, the resin-bond portion 3b under the electronic component and the fillets 3c were formed in an excellent state, which resulted in an improved bond strength of the electronic component.

The electronic-component-mounted bodies obtained were disassembled and the conductive resin portion was closely examined. It was proved: that a conductive resin in the resin-bond portion 3b under the component and the fillets 3c had the binder resin as the main conduct, and exhibited excellent electric insulation; and that the conductive resin 3a in the region where the electrodes 5 and the substrate electrodes 2 were opposed to each other had the conductive filler as the main component and exhibited excellent conductivity. The resin-bond portion 3b and the fillets 3c having the binder resin as the main component were formed with the binder resin component that had been separated from the conductive resin 3 and had flowed along surfaces of the electronic component 4 and the circuit substrate 1 upon application of heat.

Second Embodiment

The following description will depict an embodiment of the second electronic-component-mounted body manufacturing method of the present invention, while referring to FIGS. 2A to 2D.

FIGS. 2A to 2D are schematic cross-sectional views illustrating steps of the method of manufacturing an electronic-component-mounted body, in an order in which the steps are conducted.

Figure 2A:
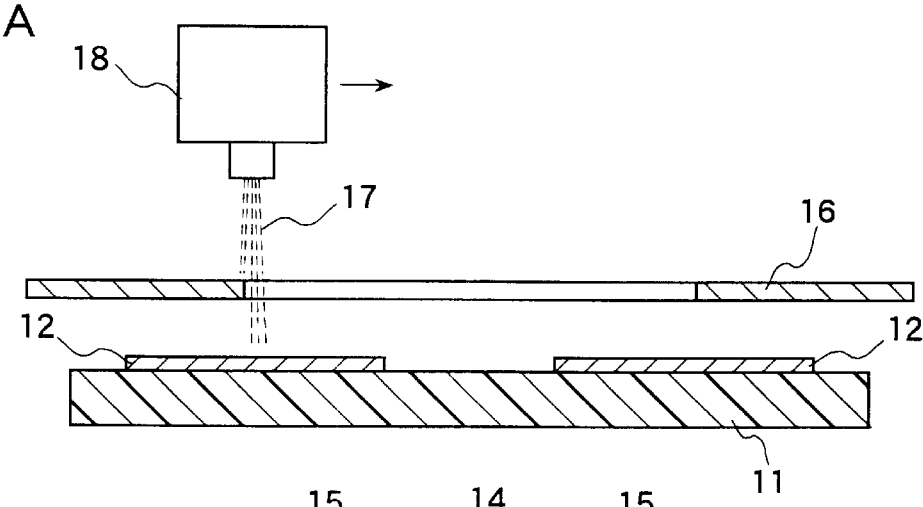
FIGS. 2A to 2D are schematic cross-sectional views illustrating a method of manufacturing an electronic-component-mounted body according to a second embodiment of the present invention.
Figure 2B:
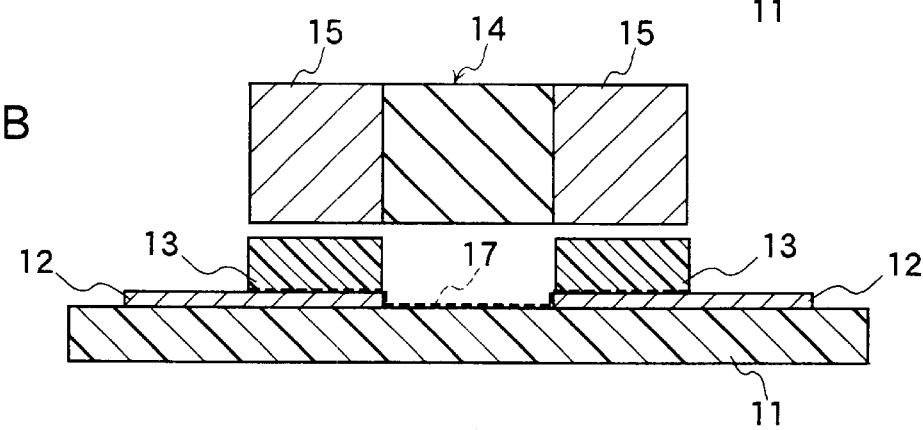
Figure 2C:
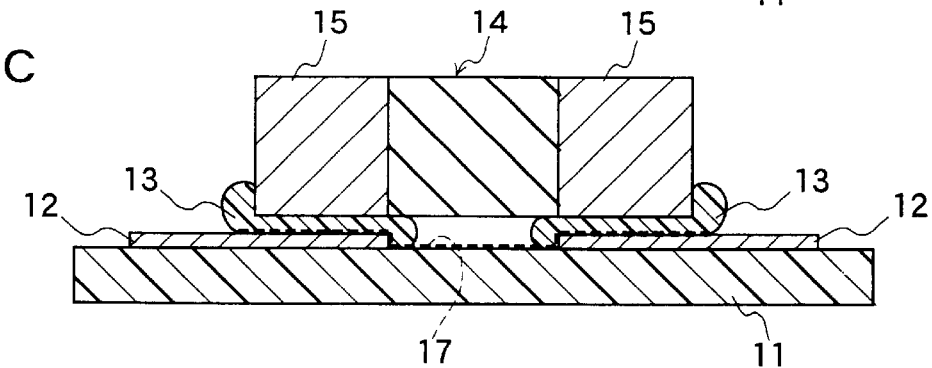
Figure 2D:
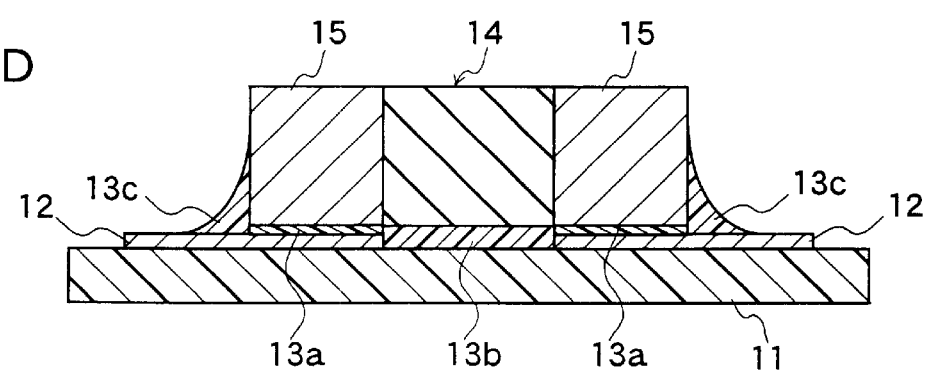

First of all, as shown in FIG. 2A, a metal mask 16 having a predetermined aperture is set over a circuit substrate 11 having substrate electrodes 12 formed thereon. Then, a material effective in improving wettability with respect to the circuit substrate 11, that is, a diethylene glycol solution 17, is sprayed over the circuit substrate 11 and the substrate electrodes 12 so as to be applied thereon, by moving a spray nozzle 18 in the arrow direction. Thereafter, as shown in FIG. 2B, a conductive resin 13 is disposed by printing at predetermined positions on the substrate electrodes 12 on the circuit substrate 11, and an electronic component (chip resistor) 14 having electrodes 15 is aligned with the same, so that the electronic component 14 is placed on the conductive resin 13 that is not yet cured as shown in FIG. 2C. Subsequently, the conductive resin 13 is heated to a curing temperature of the conductive resin 13 so as to be cured. FIG. 2D illustrates a finished state of the electronic-component-mounted body of the present invention in which the conductive resin 13 is already cured.

In the present embodiment, the diethylene glycol 17 was applied to have a thickness of approximately 5 μm.

As the conductive resin 13, a conventional conductive resin was used in which a silver filler and an epoxy resin were used as the conductive filler and as the binder resin component, respectively. The curing of the conductive resin was carried out in a hot stove set to 1500° C. for 30 minutes.

As illustrated in FIG. 2D, in the electronic-component-mounted body of the present embodiment, a region where the electronic component 14 except for the electrodes 15 was opposed to the circuit substrate 11 (i.e., an under-electronic-component region) was filled with a resin 13b containing the binder resin as the main component. Besides, resins 13c containing the binder resin as the main component adhered in fillet-like forms to the side walls of the electrodes 15 of the electronic component 14. The resins 13b and 13c were formed with the binder resin component that had been separated from the conductive resin 13 and had flowed along surfaces of the electronic component 14 and the circuit substrate 11 upon application of heat. These resins 13b and 13c containing the binder resin as the main component allow the mechanical strength of junction between the electronic component 14 and the circuit substrate 11 to be increased. On the other hand, a conductive resin 13a in regions where the electrodes 15 and the substrate electrodes 12 were opposed to each other contained the conductive filler as the main component, and exhibited excellent conductivity.

As the method of applying diethylene glycol, methods other than the foregoing spraying may be applicable, such as dipping, coating, etc. As the material effective in improving wettability, materials other than diethylene glycol may be applicable, for instance, an alcohol-type solvent such as ethylene glycol or triethylene glycol, or a reactive diluent.

In the foregoing case, diethylene glycol was applied over the circuit substrate 11 side, but alternatively, it may be applied to the electronic component 14 instead, or to the electronic component 14 and the circuit substrate 11 both.

Third Embodiment

The following description will depict an embodiment of the third electronic-component-mounted body manufacturing method of the present invention, while referring to FIGS. 3A to 3D.

FIGS. 3A to 3D are schematic cross-sectional views illustrating steps of the method of manufacturing an electronic-component-mounted body, in an order in which the steps are conducted.

Figure 3A:
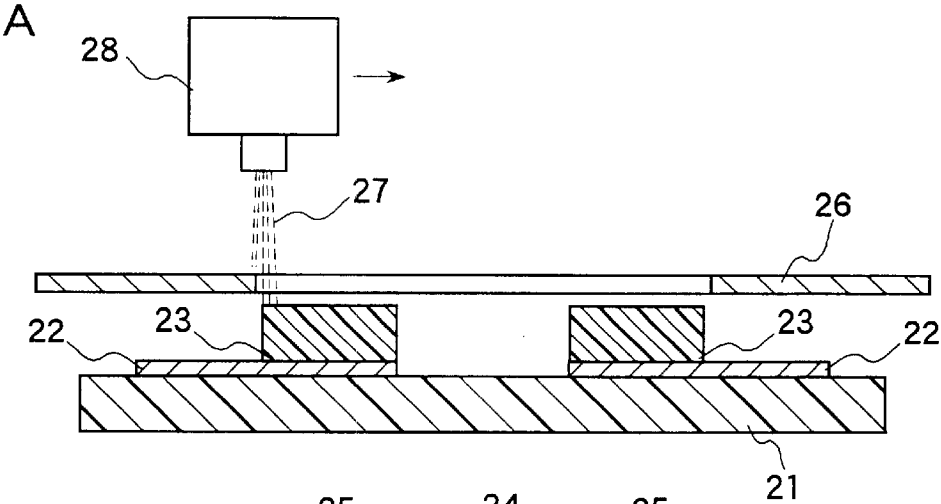
FIGS. 3A to 3D are schematic cross-sectional views illustrating a method of manufacturing an electronic-component-mounted body according to a third embodiment of the present invention.
Figure 3B:
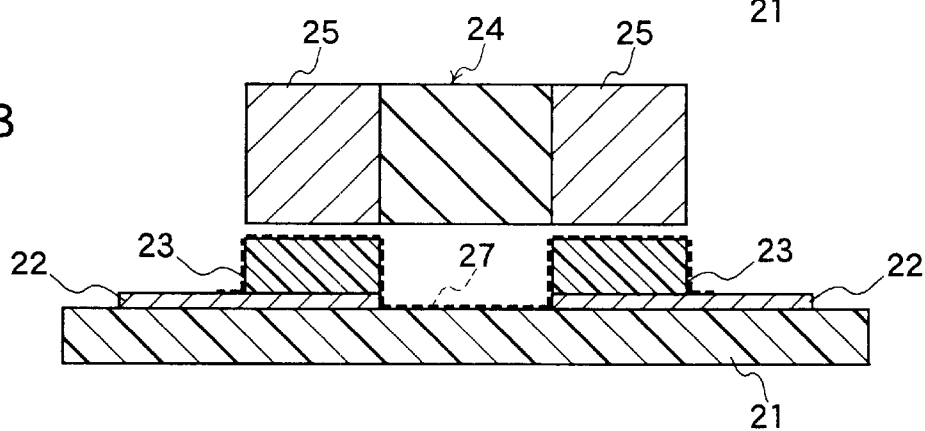
Figure 3C:
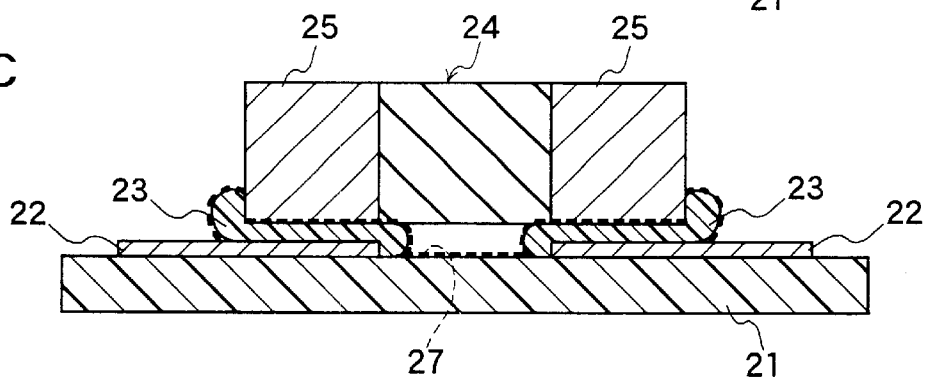
Figure 3D:
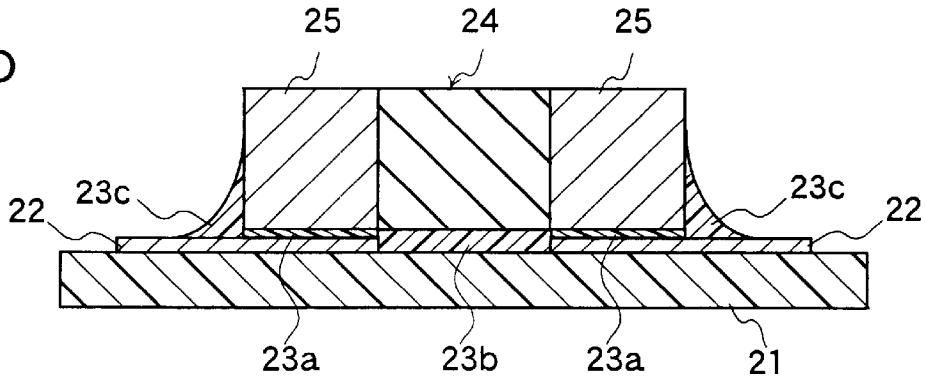

First of all, as shown in FIG. 3A, after a conductive resin 23 is disposed by printing at predetermined positions on substrate electrodes 22 provided on a circuit substrate 21, a metal mask 26 having a predetermined aperture is set, and a material effective in improving wettability with respect to the circuit substrate 21, that is, a diethylene glycol solution 27, is sprayed over the circuit substrate 21, the substrate electrodes 22, and the conductive resin 23 so as to be applied thereon, by moving a spray nozzle 28 in the arrow direction. Thereafter, as shown in FIG. 3B, an electronic component (chip resistor) 24 having electrodes 25 is aligned with the substrate electrodes 22 on the circuit substrate 21 and is placed on the conductive resin 23 that is not yet cured, as shown in FIG. 3C. Subsequently, the conductive resin 23 is heated to a curing temperature of the conductive resin 23 so as to be cured. FIG. 3D illustrates a finished state of the electronic-component-mounted body of the present invention in which the conductive resin 23 is already cured.

In the present embodiment, the diethylene glycol 27 was applied to have a thickness of approximately 5 $\mu$m.

As the conductive resin 23, a conventional conductive resin was used in which a silver filler and an epoxy resin were used as the conductive filler and as the binder resin component, respectively. The curing of the conductive resin was carried out in a hot stove set to 150° C.for 30 minutes.

As illustrated in FIG. 3D, in the electronic-component-mounted body of the present embodiment, a region where the electronic component 24 except for the electrodes 25 was opposed to the circuit substrate 21 (i.e., an under-electronic-component region) was filled with a resin 23b containing the binder resin as the main component. Besides, resins 23c containing the binder resin as the main component adhered in fillet-like forms to the side walls of the electrodes 25 of the electronic component 24. The resins 23b and 23c were formed with the binder resin component that had been separated from the conductive resin 23 and had flowed along surfaces of the electronic component 24 and the circuit substrate 21 upon application of heat. These resins 23b and 23c containing the binder resin as the main component allowed the mechanical strength of junction between the electronic component 24 and the circuit substrate 21 to increase. On the other hand, a conductive resin 23a in regions where the electrodes 25 and the substrate electrodes 22 were opposed to each other contained the conductive filler as the main component, and exhibited excellent conductivity.

As the method of applying diethylene glycol, methods other than the foregoing spraying may be applicable, such as dipping, coating, etc. As the material effective in improving wettability, materials other than diethylene glycol may be applicable, for instance, an alcohol-type solvent such as thylene glycol or triethylene glycol, or a reactive diluent.

In the foregoing case, diethylene glycol was applied over the circuit substrate 21 side, but alternatively, it may be applied to the electronic component 24 instead, or to the electronic component 24 and the circuit substrate 21 both.

Fourth Embodiment

The following description will depict an embodiment of the fourth electronic-component-mounted body manufacturing method of the present invention, while referring to FIGS. 4A to 4D.

FIGS. 4A to 4D are schematic cross-sectional views illustrating steps of the method of manufacturing an electronic-component-mounted body, in an order in which the steps are conducted.

Figure 4A:
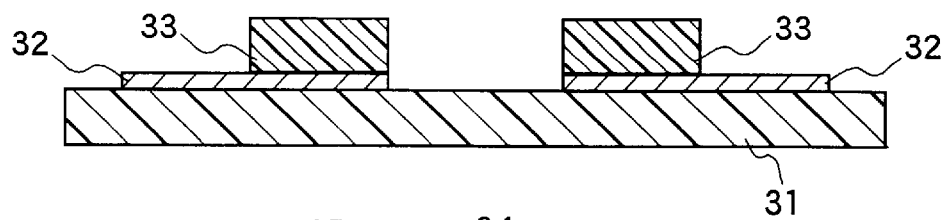
FIGS. 4A to 4D are schematic cross-sectional views illustrating a method of manufacturing an electronic-component-mounted body according to a fourth embodiment of the present invention.
Figure 4B:
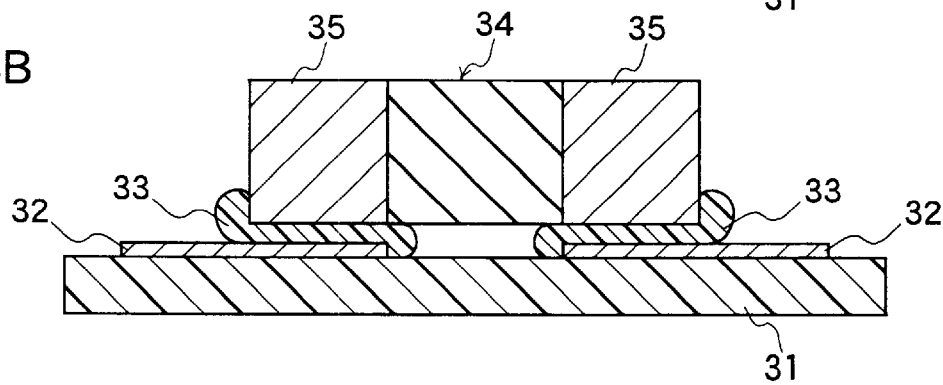
Figure 4C:
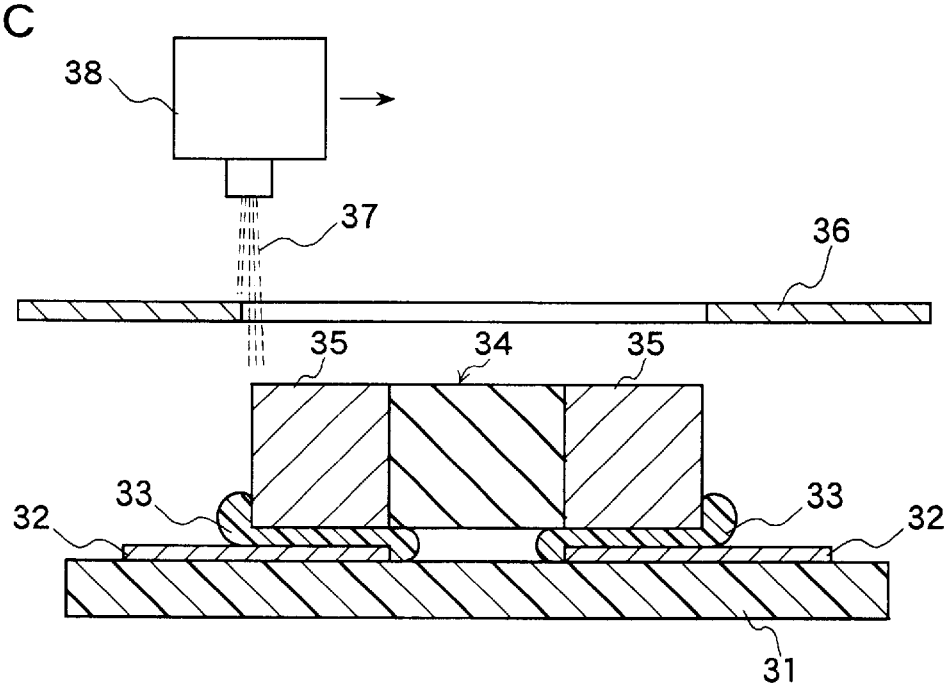
Figure 4D:
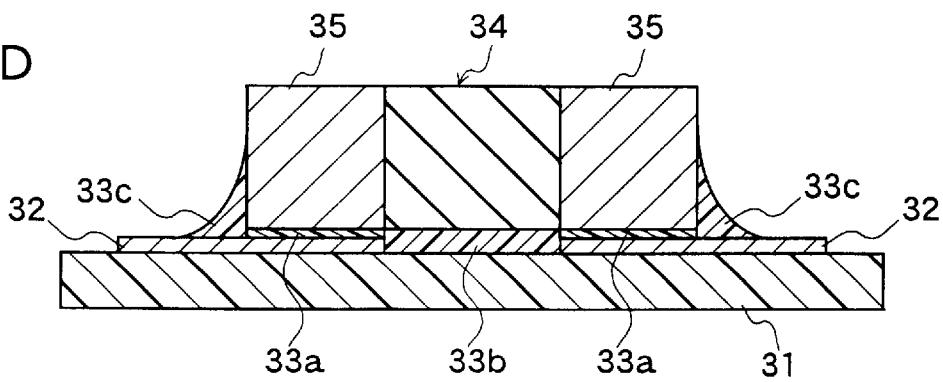

First of all, as shown in FIG. 4A, a conductive resin 33 is disposed by printing at predetermined positions on substrate electrodes 32 provided on a circuit substrate 31. Subsequently, as shown in FIG. 4B, an electronic component (chip resistor) 34 having electrodes 35 is aligned with and placed on the substrate electrodes 32 on the circuit substrate 31 that are not yet cured. Thereafter, as shown in FIG. 4C, a metal mask 36 having a predetermined aperture is set, and a material effective in improving wettability with respect to the circuit substrate 31, that is, a diethylene glycol solution 37, is sprayed over the electrode component 34, the circuit substrate 31, and the substrate electrodes 32 so as to be applied thereon, by moving a spray nozzle 38 in the arrow direction. Thereafter, the conductive resin 33 is heated to a curing temperature of the conductive resin 33 so as to be cured. FIG. 4D illustrates a finished state of the electronic-component-mounted body of the present invention in which the conductive resin 33 is already cured.

In the present embodiment, diethylene glycol was applied to have a thickness of approximately 5 $\mu$m.

As the conductive resin 33, a conventional conductive resin was used in which a silver filler and an epoxy resin were used as the conductive filler and as the binder resin component, respectively. The curing of the conductive resin was carried out in a hot stove set to 150° C for 30 minutes.

As illustrated in FIG. 4D, in the electronic-component-mounted body of the present embodiment, a region where the electronic component 34 except for the electrodes 35 was opposed to the circuit substrate 31 (i.e., an under-electronic-component region) was filled with a resin 33b containing the binder resin as the main component. Besides, resins 33c containing the binder resin as the main component adhered in fillet-like forms to the side walls of the electrodes 35 of the electronic component 34. The resins 33b and 33c were formed with the binder resin component that had been separated from the conductive resin 33 and had flowed along surfaces of the electronic component 34 and the circuit substrate 31 upon application of 35 heat. These resins 33b and 33c containing the binder resin as the main component allowed the mechanical strength of junction between the electronic component 34 and the circuit substrate 31 to increase. On the other hand, a conductive resin 33a in regions where the electrodes 35 and the substrate electrodes 32 were opposed to each other contains the conductive filler as the main component, and exhibited excellent conductivity.

As the method of applying diethylene glycol, methods other than the foregoing spraying may be applicable, such as dipping, coating, etc. As the material effective in improving wettability, materials other than diethylene glycol may be applicable, for instance, an alcohol-type solvent such as ethylene glycol or triethylene glycol, or a reactive diluent.

Shear bond strengths and the junction portion states were measured in the same manner as that in the first embodiment, as to the electronic-component-mounted bodies obtained according to the second, third, and fourth embodiments, as well as an electronic-component-mounted body (control) obtained in the same manner except that application of diethylene glycol was omitted. The outcome of the measurement is shown in Table 2 below.

TABLE 2

| MOUNTED BODY | SHEAR BOND STRENGTH (N) | PRESENCE/ABSENCE OF RESIN BONDING UNDER ELECTRONIC COMPONENT | PRESENCE/ABSENCE OF FILLET |
|---|---|---|---|
| SECOND EMBODIMENT | 41.1 | THOROUGHLY | ABOUT ½ OF COMPONENT HEIGHT |
| THIRD EMBODIMENT | 38.6 | THOROUGHLY | ABOUT ½ OF COMPONENT HEIGHT |
| FOURTH EMBODIMENT | 37.7 | THOROUGHLY | ABOUT ½ OF COMPONENT HEIGHT |
| CONTROL | 29.4 | ABSENT | ABSENT |

As shown in Table 2, the outcome proves that each of the electronic-component-mounted bodies according to the second through fourth embodiments, in which the resin-bond portion under the electronic component and the fillets were formed in an excellent state, exhibited an increased bond strength for the electronic component.

Fifth embodiment

An electronic-component-mounted body was obtained in the same manner as that in the first embodiment except that the composition of the conductive resin and the conditions for heating the same were changed as described below.

An epoxy resin (ADEKA RESIN EP-400, produced by ASAHI DENKA KOGYO K.K.), an amine-type hardener, and an epoxy-type reactive diluent (ADEKA GLYCIROL ED-501, produced by ASAHI DENKA KOGYO K.K.), and the same filler mixture as that in the first embodiment, which was composed of a scale-shape type and an approximately-spherical-shape type, were used as the binder resin as the hardener, as the reactive diluent, and as the conductive filler, respectively. By mixing and kneading them, a conductive resin was obtained. A quantity of the reactive diluent added thereto was 15 wt % with respect to the sum of the epoxy resin and the amine-type hardener.

The conductive resin was disposed on substrate electrodes on a circuit substrate by printing with use of a 0.1 mm-thick mask plate made of stainless steal having apertures at predetermined positions. Thereafter, as in the first embodiment, the electronic component was aligned with and placed on the conductive resin.

Figure 5:
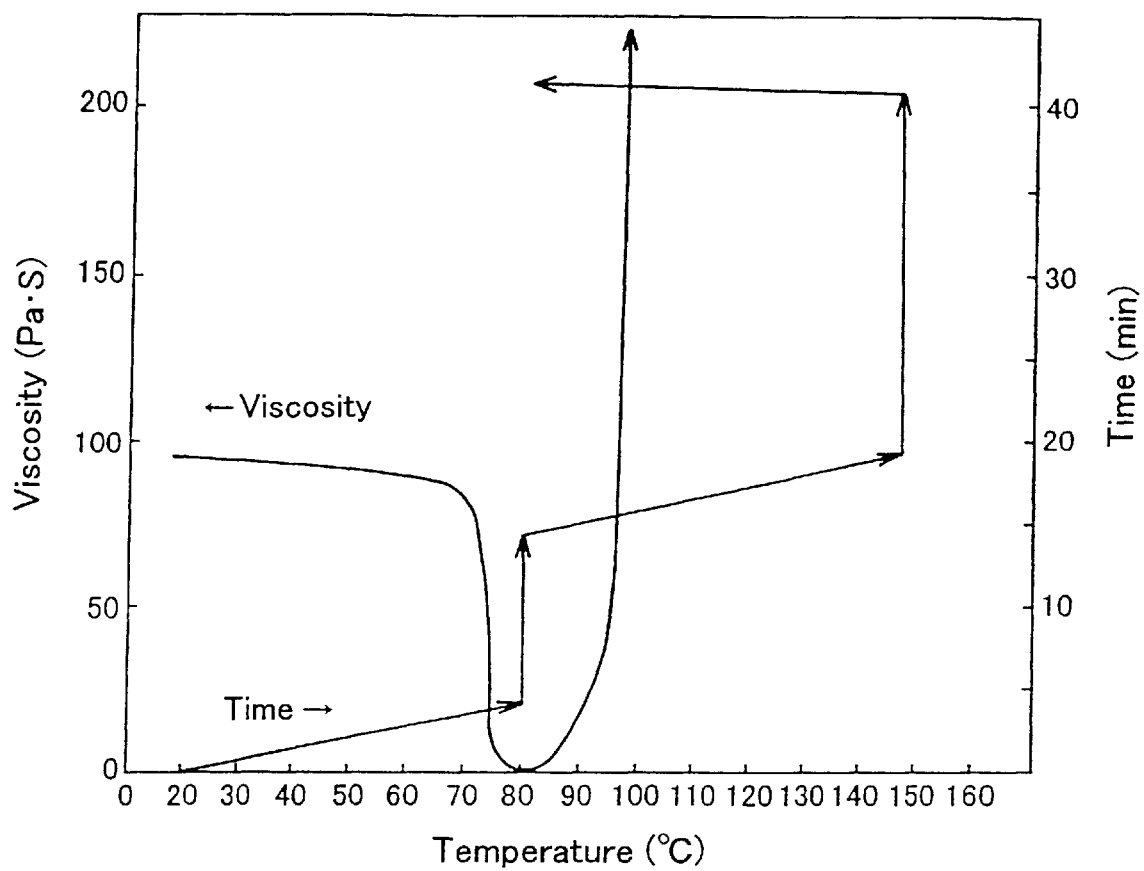
FIG. 5 is a view for explaining a process of curing a conductive resin according to a fifth embodiment of the present invention.
Figure 6:
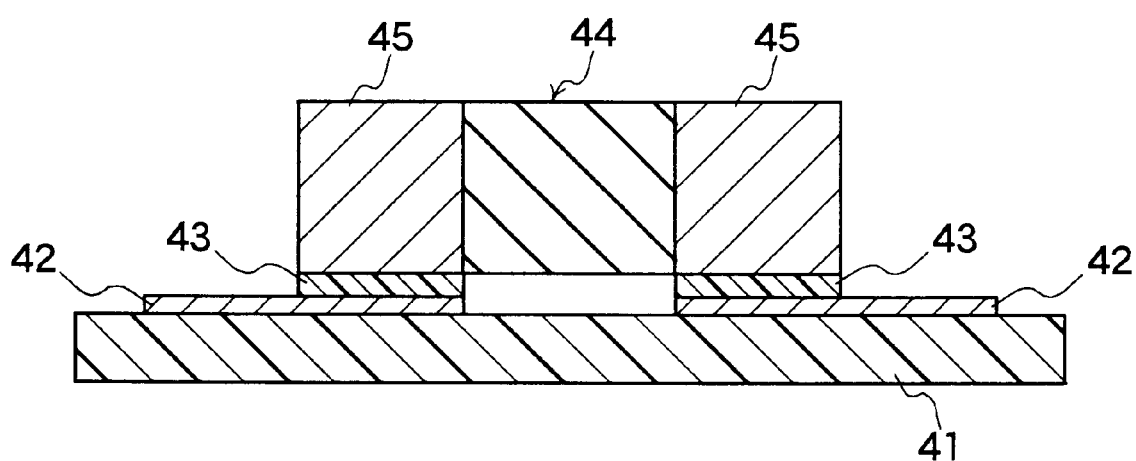
FIG. 6 is a schematic cross-sectional view illustrating a conventional electronic-component-mounted body.

Subsequently, the conductive resin was heated through a two-stage heating process so as to be cured. The following description depicts the heating conditions in the present fifth embodiment, while referring to FIG. 5. In FIG. 5, the horizontal axis indicates the temperature in the heating and curing of the conductive resin, the left vertical axis indicates the viscosity of the conductive resin of the present embodiment at each temperature, and the right vertical axis indicates the time.

As shown in FIG. 5, the sample was held at 80° C. for 10 minutes first, then at 150° C. for 20 minutes. Thereafter, it was cooled.

Since the conductive resin according to the fifth embodiment contained the reactive diluent, as shown in FIG. 5, it had a lower viscosity, and further, it was given a property that its viscosity lowers at approximately 80° C., which is lower than the curing initiation temperature of the aforementioned epoxy resin, that is, 106° C.

Therefore, at the first stage, the sample was held at approximately 80° C. at which the viscosity abruptly lowered, so that the binder resin component in the conductive resin was allowed to ooze out from the conductive resin. This causes the content of the conductive filler in the conductive resin to increase in the region where the electrode of the electronic component and the electrode on the circuit substrate are opposed to each other, while causing the binder resin component to ooze out to the region except for the foregoing electrode-opposed region. Subsequently, at the second stage, the sample was held at 150° C., which was higher than the curing initiation temperature, for a predetermined period, so that the binder resin component was cured.

The mounted body thus obtained was evaluated in the same manner as in the first embodiment. The shear bond strength of the electronic component was 50.6N. The space between the lower surface of the electronic component except for the electrode surface and the circuit substrate was filled thoroughly with the resin mainly composed of the binder resin. Further, fillet-like reinforcing portions containing the binder resin as its main component were formed on the side walls of the electrode of the electronic component, so as to have a height of approximately ½ of the height of the electronic component.

An increase in the junction strength of an electronic-component-mounted body has been a significant challenge in realizing practical utilization of an electronic-component-mounted body, and as described above, the present invention met this challenge of an increase in the junction strength, as compared with a conventional electronic-component-mounted body with the conductive resin used therein. Therefore, this enables practical utilization of various types of electronic apparatuses with small environmental loads.

The embodiments described above merely intend to clarify technical details of the present invention and the present invention should not be interpreted as being limited to such specific examples. The present invention can be carried out by being modified variously within a range of claims and without departing from its spirit and should be interpreted broadly.

What is claimed is:

1. A conductive resin, comprising a conductive filler and a binder resin as a main component, the conductive filler being substantially homogeneously dispersed in the binder resin, wherein:

the conductive resin before being cured is used to bond a plurality of adhesion targets; and when the conductive resin is heated, the conductive filler and the binder resin are substantially separated from each other, so that the conductive resin after being cured has a portion containing the conductive filler as a main component and a portion containing the binder resin as a main component.

2. The conductive resin according to claim 1, further comprising a diluent component, the diluent component being not less than 1 percent by weight and not more than 50 percent by weight with respect to a total amount of organic components of the conductive resin.

3. The conductive resin according to claim 2, wherein the diluent component is a solvent, a reactive diluent, or a mixture of the same.

4. The conductive resin according to claim 1, wherein the conductive filler possesses a property of catching on one another.

5. An electronic-component-mounted body, comprising an electronic component having an electrode and a circuit substrate having an electrode, the electrode of the electronic component and the electrode of the circuit substrate being connected with each other via a conductive resin containing a conductive filler and a binder resin, wherein:

in a region where the electrodes are opposed to each other, the conductive resin has the conductive filler as a main component; and in a region except for the region where the electrodes are opposed to each other, at least a part of the conductive resin has the binder resin as a main component.

6. The electronic-component-mounted body according to claim 5, wherein the conductive resin is a resin such that heating of the conductive resin having been applied between the electrodes causes the conductive filler and the binder resin to be substantially separated so that a portion having the conductive filler as a main component and a portion having the binder resin as a main component are formed.

7. The electronic-component-mounted body according to claim 5, wherein a portion having the conductive filler as the main component has a volume resistivity value of not more than $1 \times 10^{-1}$ $\Omega \cdot cm$, and a portion having the binder resin as the main component has a volume resistivity value of not less than $1 \times 10^{+3}$ $\Omega \cdot cm$.

8. The electronic-component-mounted body according to claim 5, wherein in the region where the electronic component except for the electrode and the circuit substrate are opposed to each other, connection entirely is made via a portion having the binder resin as the main component.

9. An electronic-component-mounted body manufacturing method, comprising the steps of:

applying the conductive resin according to claim 1 at a predetermined position on a circuit substrate;

placing an electronic component at the predetermined position where the conductive resin is applied; and curing the conductive resin, these steps being conducted in the stated order.

10. An electronic-component-mounted body manufacturing method, comprising the steps of:

applying to at least either one of a circuit substrate and an electronic component a material effective in improving wettability of a binder resin of a conductive resin with respect to the circuit substrate or a component member of the electronic component;

applying the conductive resin at a predetermined position on the circuit substrate;

placing the electronic component at the predetermined position where the conductive resin is applied; and curing the conductive resin, these steps being conducted in the stated order.

11. An electronic-component-mounted body manufacturing method, comprising the steps of:

applying a conductive resin at a predetermined position on a circuit substrate;

applying to at least one of the circuit substrate, the conductive resin, and an electronic component a material effective in improving wettability of a binder resin of the conductive resin with respect to the circuit substrate or a component member of the electronic component;

placing the electronic component at the predetermined position where the conductive resin is applied; and curing the conductive resin, these steps being conducted in the stated order.

12. An electronic-component-mounted body manufacturing method, comprising the steps of:

applying a conductive resin at a predetermined position on a circuit substrate;

placing an electronic component at the predetermined position where the conductive resin is applied;

applying to at least a portion where the electronic component is placed a material effective in improving wettability of a binder resin of the conductive resin with respect to the circuit substrate or a component member of the electronic component; and curing the conductive resin, these steps being conducted in the stated order.

13. The electronic-component-mounted body manufacturing method according to claim 10, wherein the material effective in improving wettability of the binder resin with respect to the circuit substrate or the component member of the electronic component is an alcohol-type solvent or a reactive diluent.

14. The electronic-component-mounted body manufacturing method according to claim 9, wherein the step of curing the conductive resin includes:

a viscosity lowering sub-step for causing the binder resin having been substantially separated from the conductive resin to ooze out; and a binder resin curing sub-step, these sub-steps being conducted in the stated order.

15. The electronic-component-mounted body manufacturing method according to claim 9, wherein in the step of curing the conductive resin, the binder resin substantially separated from the conductive resin oozes out, and connection is made via a resin containing as the main component the binder resin that has oozed, in at least a part of a region except for the region where the electrode of the electronic component and the electrode of the circuit substrate are opposed to each other.

16. The electronic-component-mounted body manufacturing method according to claim 11, wherein the material effective in improving wettability of the binder resin with respect to the circuit substrate or the component member of the electronic component is an alcohol-type solvent or a reactive diluent.

17. The electronic-component-mounted body manufacturing method according to claim 10, wherein the step of curing the conductive resin includes:

a viscosity lowering sub-step for causing the binder resin having been substantially separated from the conductive resin to ooze out; and a binder resin curing sub-step, these sub-steps being conducted in the stated order.

18. The electronic-component-mounted body manufacturing method according to claim 10, wherein in the step of curing the conductive resin, the binder resin substantially separated from the conductive resin oozes out, and connection is made via a resin containing as the main component the binder resin that has oozed, in at least a part of a region except for the region where the electrode of the electronic component and the electrode of the circuit substrate are opposed to each other.

19. The electronic-component-mounted body manufacturing method according to claim 12, wherein the material effective in improving wettability of the binder resin with respect to the circuit substrate or the component member of the electronic component is an alcohol-type solvent or a reactive diluent.

20. The electronic-component-mounted body manufacturing method according to claim 11, wherein the step of curing the conductive resin includes:

a viscosity lowering sub-step for causing the binder resin having been substantially separated from the conductive resin to ooze out; and a binder resin curing sub-step, these sub-steps being conducted in the stated order.

21. The electronic-component-mounted body manufacturing method according to claim 11, wherein in the step of curing the conductive resin, the binder resin substantially separated from the conductive resin oozes out, and connection is made via a resin containing as the main component the binder resin that has oozed, in at least a part of a region except for the region where the electrode of the electronic component and the electrode of the circuit substrate are opposed to each other.

22. The electronic-component-mounted body manufacturing method according to claim 12, wherein the step of curing the conductive resin includes:

a viscosity lowering sub-step for causing the binder resin having been substantially separated from the conductive resin to ooze out; and a binder resin curing sub-step, these sub-steps being conducted in the stated order.

23. The electronic-component-mounted body manufacturing method according to claim 12, wherein in the step of curing the conductive resin, the binder resin substantially separated from the conductive resin oozes out, and connection is made via a resin containing as the main component the binder resin that has oozed, in at least a part of a region except for the region where the electrode of the electronic component and the electrode of the circuit substrate are opposed to each other.

* * * * *

UNITED STATES PATENT AND TRADEMARK OFFICE
CERTIFICATE OF CORRECTION

PATENT NO.    : 6,510,059 B2
DATED         : January 21, 2003
INVENTOR(S)   : Mitani et al.

It is certified that error appears in the above-identified patent and that said Letters Patent is hereby corrected as shown below:

Column 11,
Line 27, "under the component" should read -- under the electric component --
Line 28, "main conduct," should read -- main component, --

Column 12,
Line 21, "1500°C. for 30 minutes." should read -- 150°C. for 30 minutes. --

Column 13,
Line 49, "thylene glycol" should read -- ethylene glycol --

Column 14,
Line 41, "application of 35 heat." should read -- application of heat. --

Signed and Sealed this

Sixteenth Day of December, 2003

JAMES E. ROGAN
*Director of the United States Patent and Trademark Office*